(12) United States Patent
Cern

(10) Patent No.: US 7,286,035 B2
(45) Date of Patent: Oct. 23, 2007

(54) HIGHLY INSULATED INDUCTIVE DATA COUPLERS

(76) Inventor: Yehuda Cern, 35 Columbia St., Brookline, MA (US) 02446

(*) Notice: Subject to any disclaimer, the term of this patent is extended or adjusted under 35 U.S.C. 154(b) by 268 days.

(21) Appl. No.: 11/205,804

(22) Filed: Aug. 17, 2005

(65) Prior Publication Data

US 2006/0008204 A1    Jan. 12, 2006

Related U.S. Application Data

(62) Division of application No. 10/688,262, filed on Oct. 17, 2003, now Pat. No. 7,109,835.

(60) Provisional application No. 60/419,174, filed on Oct. 17, 2002.

(51) Int. Cl.
*H01F 27/02* (2006.01)

(52) U.S. Cl. .................................. 336/84 C; 336/84 R

(58) Field of Classification Search .................. 336/65, 336/83, 84 R, 84 C, 173–175, 219
See application file for complete search history.

(56) References Cited

U.S. PATENT DOCUMENTS 3,959,761 A    5/1976    Graul

| 4,030,058 A | * | 6/1977 | Riffe et al. ..................... 336/92 |
| 4,327,349 A | | 4/1982 | Ettinger et al. |
| 4,471,133 A | | 9/1984 | Hallgren |
| 6,822,363 B2 | | 11/2004 | Leijon |
| 7,078,996 B1 | * | 7/2006 | Cern et al. ................... 336/175 |
| 7,109,835 B2 | * | 9/2006 | Cern ......................... 336/84 C |
| 7,158,003 B2 | * | 1/2007 | Cern et al. ................... 336/175 |

FOREIGN PATENT DOCUMENTS

DE    9315875    12/1993

* cited by examiner

*Primary Examiner*—Tuyen T. Nguyen
(74) *Attorney, Agent, or Firm*—Ohlandt, Greeley, Ruggiero & Perle, L.L.P.

(57) ABSTRACT

There is provided an inductive coupler for coupling a signal to a power line. The inductive coupler includes a magnetic core for placement about the power line, and a coil wound around a portion of the magnetic core. The coil includes a coaxial cable having a non-insulative outer layer coupled to a stress cone. The non-insulative outer layer is at an electrical potential about equal to that of the power line when the inductive coupler is installed on the power line.

18 Claims, 7 Drawing Sheets

HIGHLY INSULATED INDUCTIVE DATA COUPLERS

CROSS-REFERENCE TO RELATED APPLICATIONS

The present application is a divisional of U.S. patent application Ser. No. 10/688,262, filed Oct. 17, 2003 now U.S. Pat. No. 7,109,835, which claims priority of U.S. Provisional Patent Application Ser. No. 60/419,174, filed on Oct. 17, 2002, the content of which is herein incorporated by reference.

BACKGROUND OF THE INVENTION

1. Field of the Invention

The present invention relates to power line communications, and more particularly, to a data coupler being insulated in a manner that minimizes voltage breakdowns.

2. Description of the Related Art

An inductive coupler for power line communications couples a data signal between the power line and a communication device such as a modem. The inductive coupler may suffer from insulation breakdown or partial discharge at unsuitably low line voltages. Breakdown or partial discharge will generally occur at a location within the coupler where an electric field is concentrated in an insulating material or where an excessively high field is created through the air.

FIG. 1 shows a cross-section of a prior art inductive coupler. A power line 800, e.g., a phase line, serves as a primary winding for the inductive coupler, and thus passes through an aperture of a magnetic circuit with a core configured with an upper core portion that includes a core section 805 and a lower core portion that includes a core section 810, and air gaps 830 and 835. A secondary winding 820 also passes through the aperture, surrounded by an insulating material 825. Power line 800 touches core section 805 at a contact point 855, while secondary winding 820 is grounded. Core sections 805 and 810 are made of a magnetic core material. An electric field inside of core sections 805 and 810 depends on conductivity and permittivity of the core material.

For the case of power line 800 being bare, the full phase voltage is applied to the coupler, specifically between contact point 855 and secondary winding 820.

Referring to FIG. 2, for the case of power line 800 being covered with insulation, there is shown power line 800 having insulation 860 that contacts core section 805 at a contact point 865. A capacitive voltage divider is formed between (a) a capacitor formed between power line 800, insulation 860, and core section 805, and (b) a capacitance between contact point 865 and secondary winding 820. The voltage stress between contact point 865 and ground is then less than the full phase voltage.

A plane where secondary winding 820 exits core section 810, core section 810 presents a sharp corner. In general, there may be two locations susceptible to ionization and voltage breakdown, (1) an air path 840 between power line 800 and insulating material 825, and (2) a region between of the corners of core section 810 and the exiting of secondary winding 820 from core section 810.

Air path 840 is susceptible to ionization and voltage breakdown, as follows. Insulating material 825 is likely to be constructed from a plastic or other material with a permittivity of 2.5-3.5. A capacitive voltage division of a voltage difference between power line 800 and secondary winding 820 will place most of the voltage difference in air path 840, and relatively little of the voltage difference across an insulation path 850. The insulating capability of air is inferior to that of plastic or other insulating material, so as voltage on power line 800 increases, a breakdown is most likely across path 840.

FIG. 3 shows a horizontal cross section drawn through a secondary winding 820 such as that shown in FIG. 1. The lower core portion is shown as being configured with a plurality of core sections, namely core sections 810, 811, 812 and 813. Secondary winding 820 passes through core sections 810, 811, 812 and 813. Regions 1000, 1005, 1010 and 1015 represent regions of electric field concentration, and might cause initial insulation breakdown at a voltage on power line 800 that is much lower than desired.

SUMMARY OF THE INVENTION

An embodiment of an inductive coupler for coupling a signal to a power line includes a magnetic core for placement about the power line, and a coil wound around a portion of the magnetic core. The coil includes a coaxial cable having a non-insulative outer layer coupled to a stress cone. The non-insulative outer layer is at an electrical potential about equal to that of the power line when the inductive coupler is installed on the power line.

Another embodiment of an inductive coupler includes (i) a magnetic core having an aperture through which a power line is routable, (ii) a cable having a center conductor routed through the aperture, and having a portion external to the aperture, (iii) a stress cone through which the center conductor is routed, and (iv) a semiconducting coating that (a) encapsulates the magnetic core and the portion of the cable that is external to the aperture, and (b) contacts the stress cone. The semiconducting coating contacts the power line when the inductive coupler is installed on the power line.

DESCRIPTION OF THE INVENTION

A highly insulated inductive data coupler, in accordance with the present invention, virtually eliminates high electric fields through air paths, and limits those fields to locations filled with dielectric material. Rounded geometries are employed on all energized bodies to eliminate any pointy features that might generate a high local field. Also, upper and lower core portions are placed inside a single common equipotential envelope, making the coupler indifferent to dielectric properties of magnetic cores, and eliminates electric fields within the cores and between upper and lower core portions.

Figure 4:
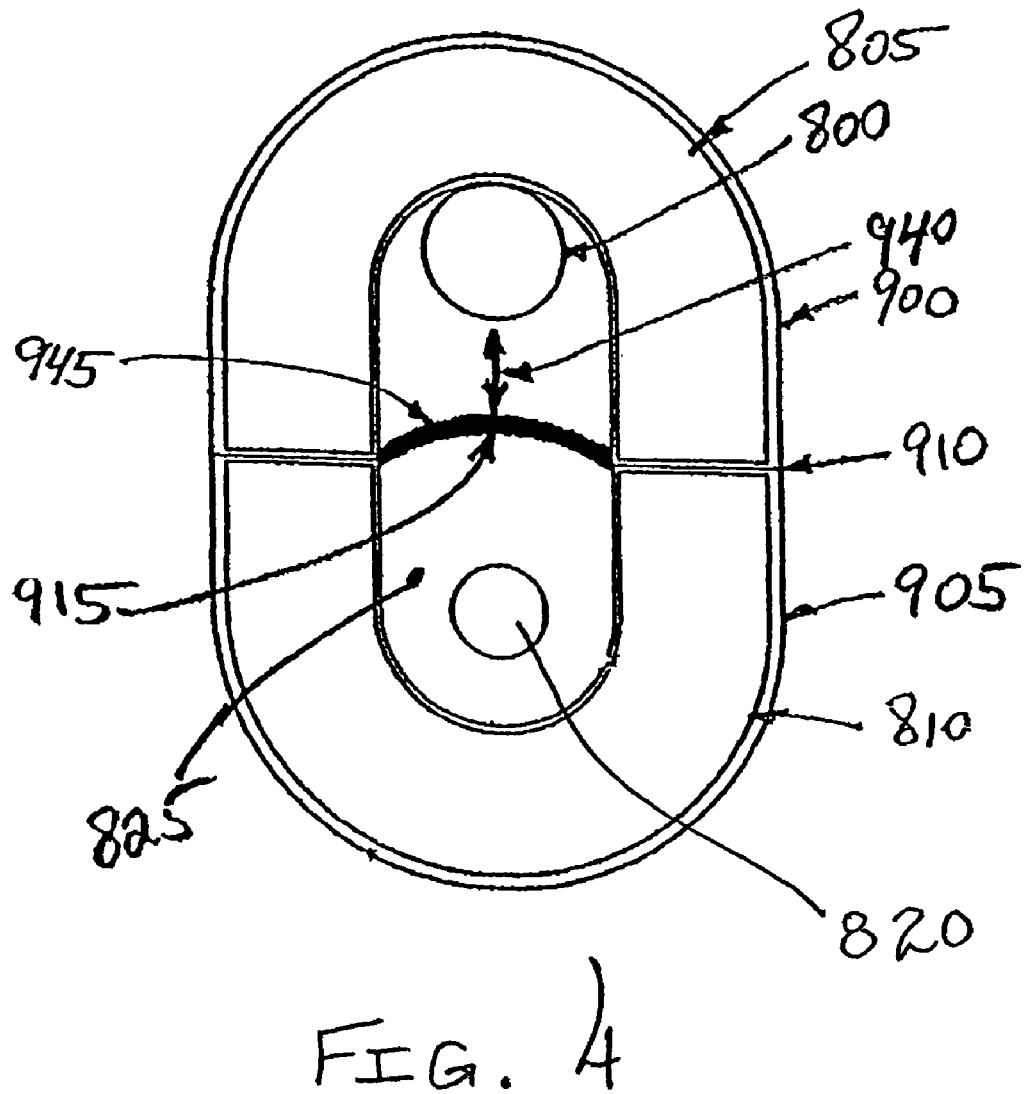
FIG. 4 is a cross section of a highly insulated inductive data coupler, perpendicular to a power line.

FIG. 4 is a cross section of a highly insulated inductive data coupler in accordance with the present invention. The coupler includes a magnetic core for placement about power line 800. The magnetic core is configured with an upper core portion that includes core section 805 and a lower portion that includes core section 810. The designation of core portions as being "upper" and "lower" merely refers to their respective positions in the drawings of the present disclosure, and such designation is not necessarily descriptive of an actual physical relationship of the core portions. Secondary winding 820 is connected to a communication device (not shown) such as a modem, and thus, the coupler enables a data signal to be coupled between power line 800 and the communication device.

Each of core section 805 and core section 810 are encapsulated in boots or coatings 900 and 905 made of a semiconductor material. Examples of suitable semiconductor materials are plastics or rubbers impregnated with graphite or silicon carbide to provide a desired bulk resistivity. An electrical contact 910 is made between coating 900 and coating 905. Core sections 805 and 810 and coatings 900 and 905 thus become a single, essentially equipotential body.

A surface 915 of insulating material 825 is covered with a semiconducting coating 945, which overlaps coating 905 and makes electrical contact with coating 905. The potential of coating 945 is thus made essentially equal to the surface of power line 800, eliminating or greatly reducing the voltage across an air path 940. This permits an inductive coupler that includes secondary winding 820 and core sections 805 and 810, and employs power line 800 as a primary winding, to be safely used on higher primary voltages than would be possible without semiconducting coating 945.

Figure 1:
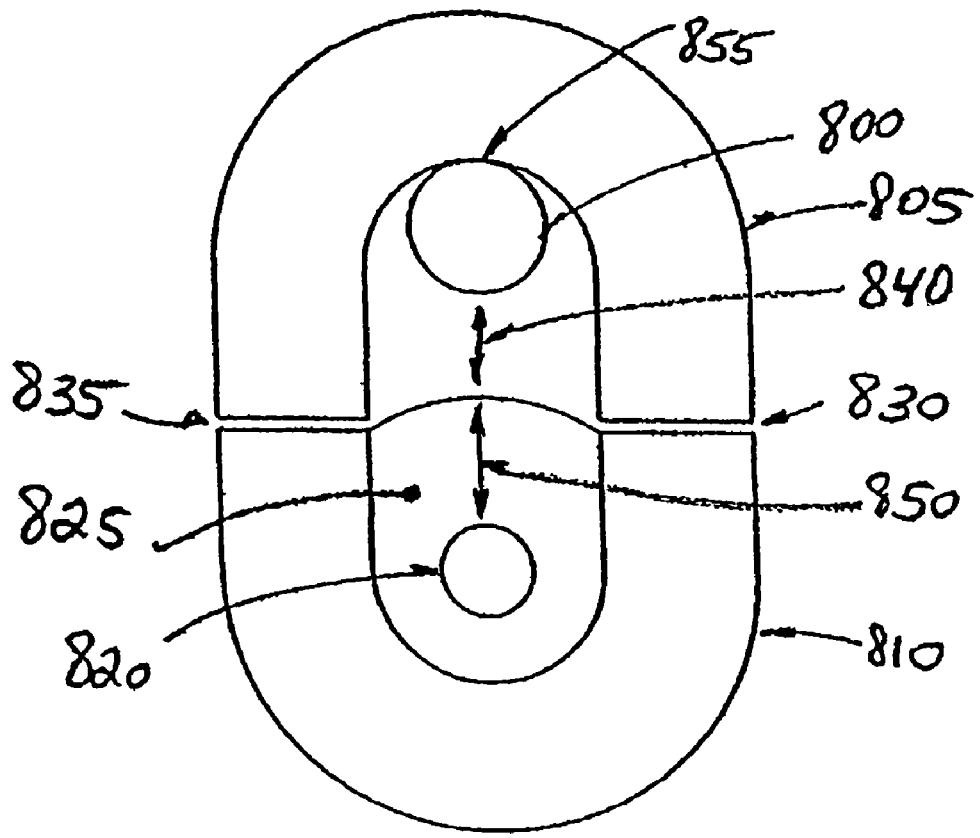
FIG. 1 shows a cross-section of a prior art inductive coupler, perpendicular to a power line.
Figure 2:
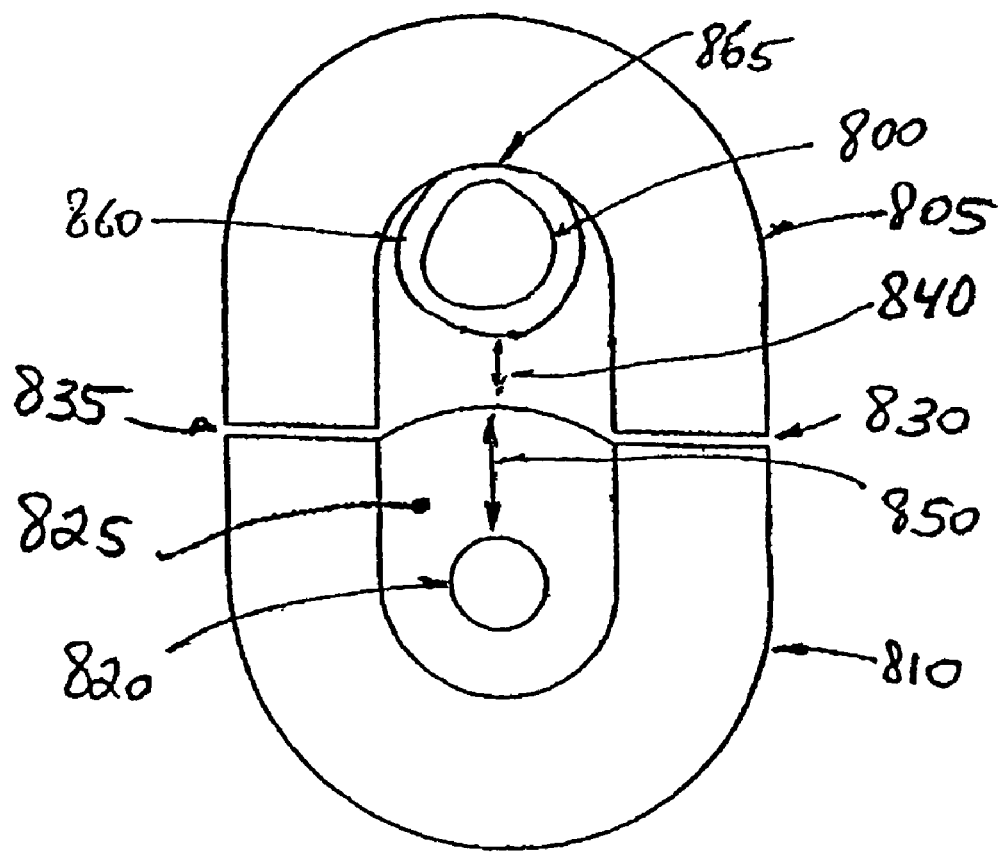
FIG. 2 shows a cross-section of another embodiment of a prior art inductive coupler.
Figure 3:
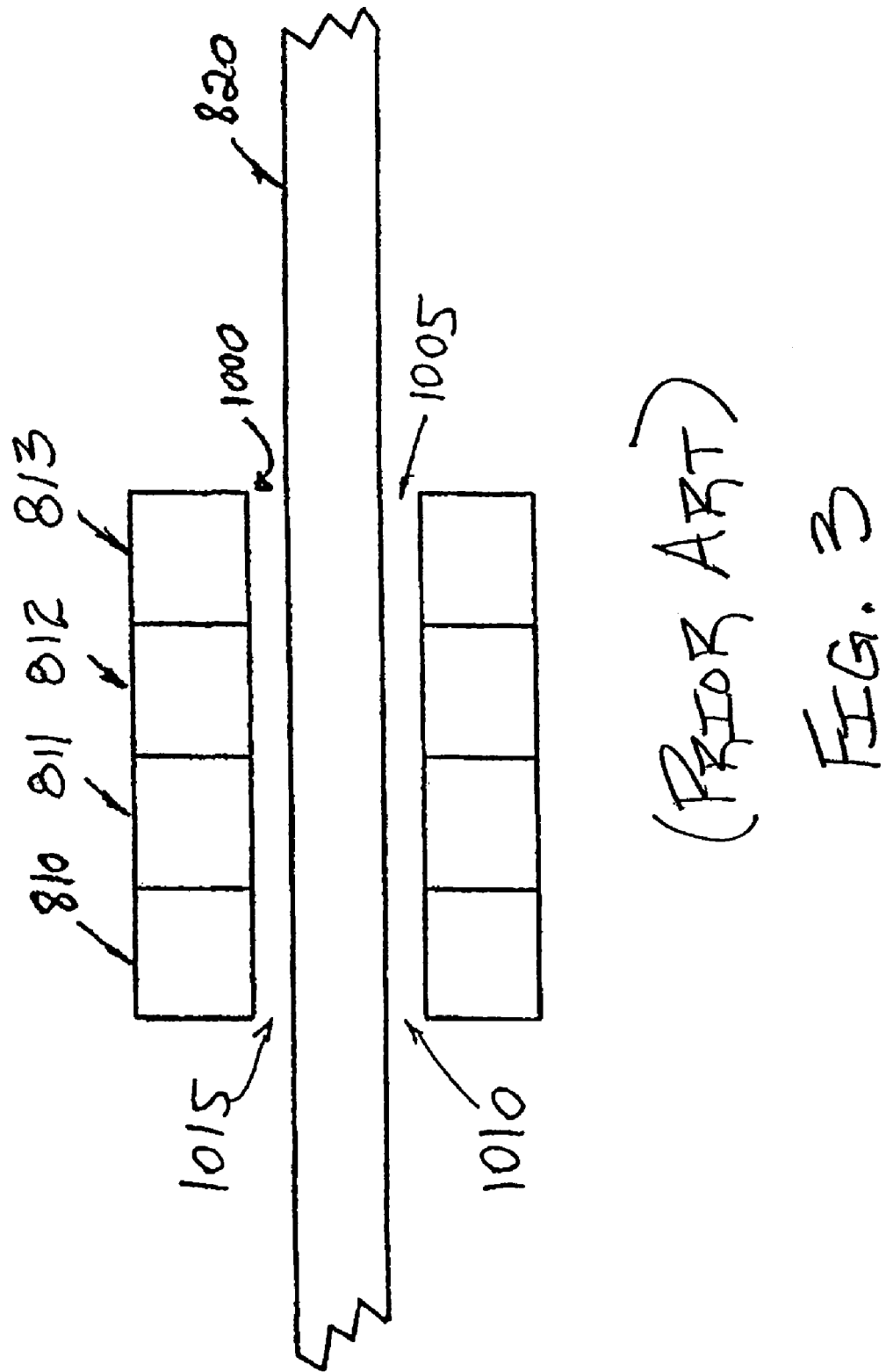
FIG. 3 shows a horizontal cross section drawn through secondary winding of an inductive coupler such as that of FIG. 1.
Figure 5:
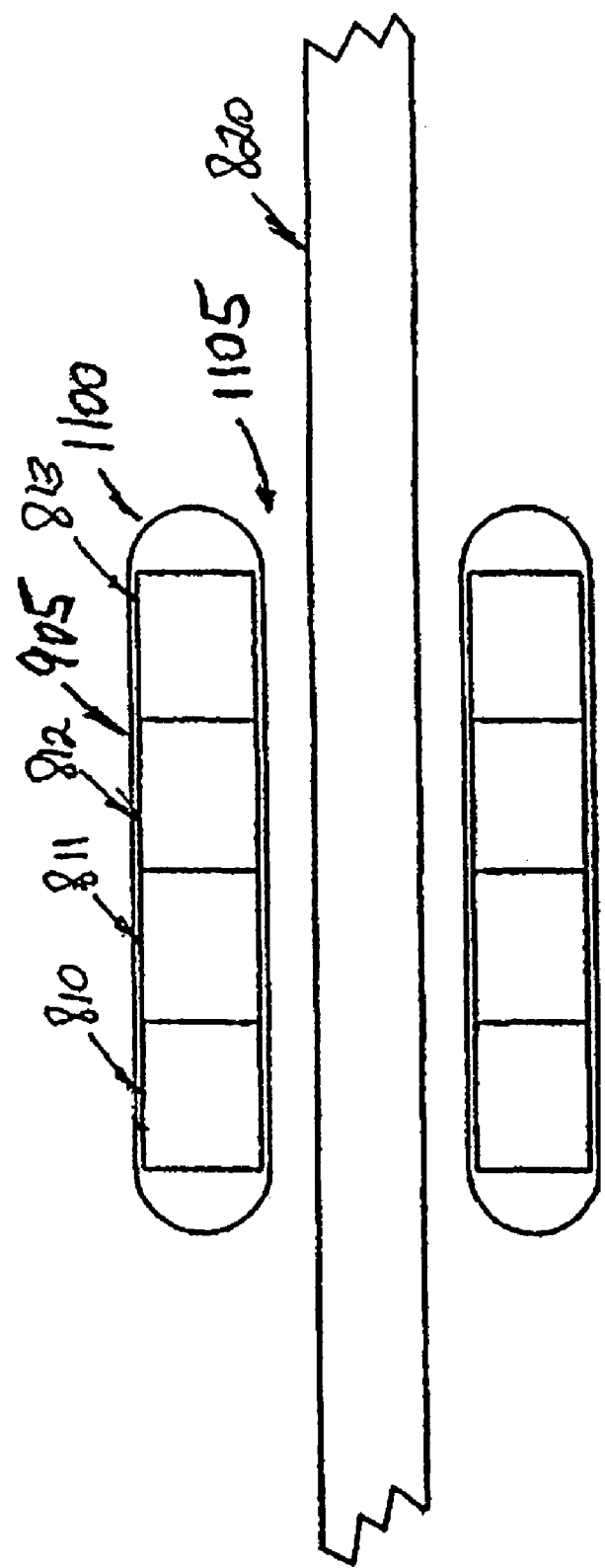
FIG. 5 shows a horizontal cross section drawn through a lower core portion of a highly insulated inductive data coupler, such as that of FIG. 4.

FIG. 5 shows a horizontal cross section drawn through a lower core portion of a highly insulated inductive data coupler, such as that of FIG. 4. The lower core portion is, in turn, configured with a plurality of core sections, namely core sections 810, 811, 812 and 813. The inductive data coupler of FIG. 5, when compared to that of FIG. 3, experiences a reduction of field concentration in region 1105, as compared to region 1000, at the exit of the secondary winding 820 from core section 813. Coating 905 is equipped with a rounded profile 1100, which provides a rounded extension to the side of core section 813. Rounding the shapes of energized bodies, such as core section 813, reduces the maximum electric field in region 1105 for a given voltage carried on power line 800 (FIG. 1). Conversely, for a given insulating material 825 (FIG. 1) having a maximum voltage breakdown rating, the applied voltage on power line 800 may be increased, relative to that permissible when sharp corners are present.

Secondary winding 820 is shown in FIG. 5 with a single pass through the core. In practice, secondary winding 820 may be configured as a coil, wound around a portion of the core.

There is thus provided an inductive coupler for coupling a signal to a power line. The inductive coupler includes (a) a magnetic core for placement about the power line, (b) a coil wound around a portion of the magnetic core, where the signal is coupled to the coil, and (c) a semiconducting coating that encapsulates the core and contacts the power line. The core has a longitudinal end, and so the inductive coupler also includes a rounded semiconducting body that covers the longitudinal end and is in electrical contact with the semiconducting coating. The coil has a lead emerging from the core, and so the inductive coupler also includes a semiconducting layer over the end, to reduce electrical stress between the power line and a surface of an insulation covering the coil.

Figure 6:
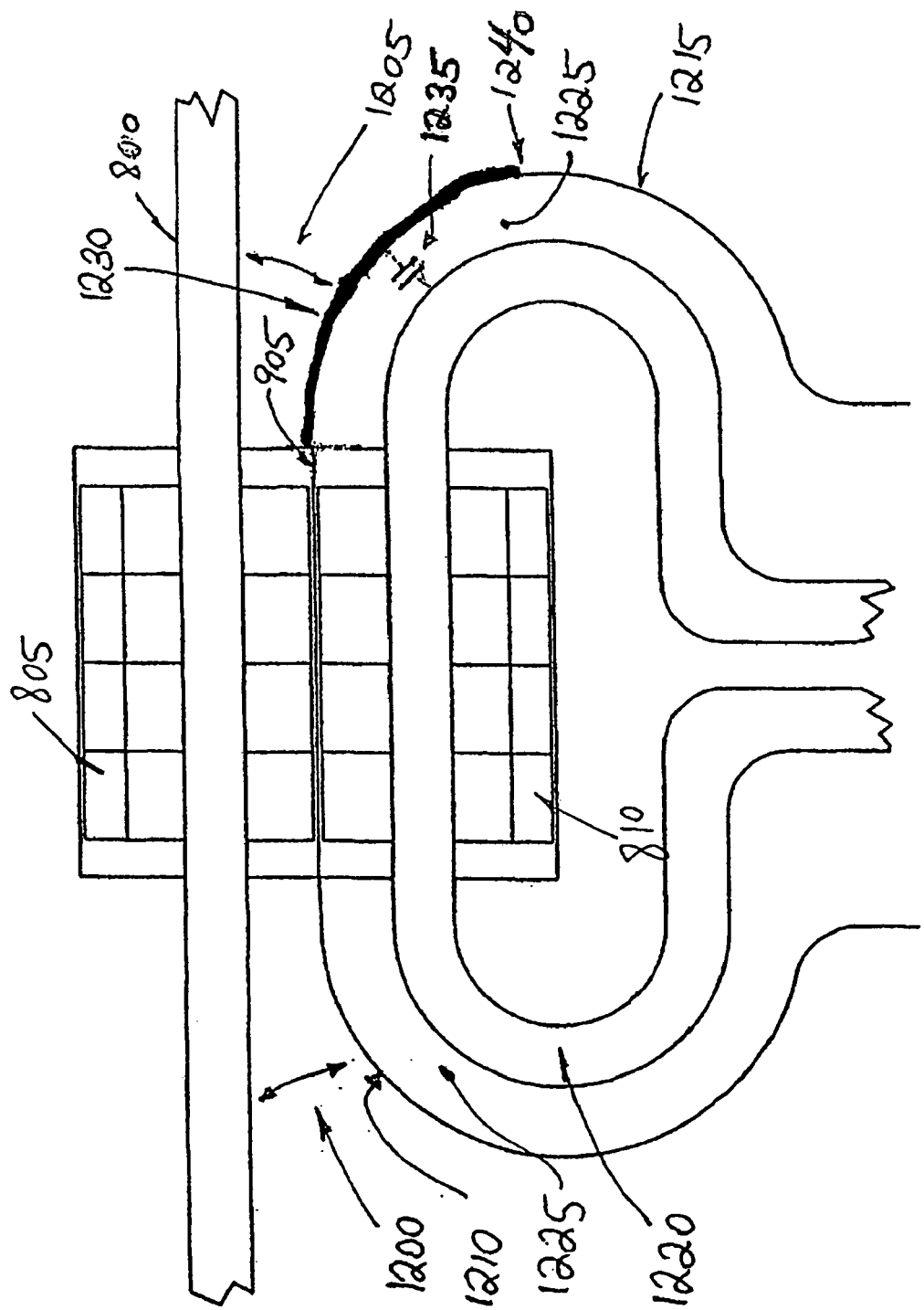
FIG. 6 is a vertical cross-section through an arrangement employing an inductive coupler having a semiconductive coating.

FIG. 6 is a vertical cross-section through an arrangement employing an inductive coupler having a semiconductive coating. An air path 1200 is susceptible to ionization and breakdown between power line 800 and a surface 1210 of an insulating layer 1225 surrounding a grounded secondary winding 1220. A potential difference between power line 800 and secondary winding 1220 is capacitively divided between air path 1200 and insulating layer 1225. A greater proportion of the potential difference occurs across air path 1200 as compared to the potential difference across insulating layer 1225, and air path 1200 is also the poorer insulator.

To mitigate this situation, a technique similar to that used in stress cones is employed. A stress cone is used at the termination of cables having two conductors and provides a gradual decrease of electric potential so as to reduce field concentrations that might lead to insulation breakdown. This is illustrated on the right half of FIG. 6. Embedded in insulating layer 1225, a semiconducting layer 1230 is sandwiched between secondary winding 1220 and a surface 1215 of insulating layer 1225, and connected to coating 905 of core sections 805 and 810. Semiconducting layer 1230 includes a combination of series resistance and stray capacitance 1235 that causes potential to decrease with distance from the longitudinal end of the semiconductive core coating 905, avoiding any excessive electrical stress concentration at the distal edge 1240 of semiconducting layer 1230. Semiconducting layer 1230 thus raises the potential of surface 1215 to be close to the primary potential of power line 800, greatly reducing the potential difference across air path 1205, and preventing breakdown at unacceptably low primary voltages on power line 800.

Secondary winding 1220 is shown in FIG. 6 with a single pass through the core. In practice, secondary winding 1220 may be configured as a coil, wound around a portion of the core.

Eliminating large potential differences across air paths and eliminating points of high electrical stress can be achieved by a combination of techniques. In one technique, the cores are coated by a semiconducting layer, as described above in association with FIGS. 4 and 5. For another technique, a section of high voltage cable is employed or specially molded for the coupler. The cable has an external semiconducting layer that is energized by conductive or capacitive contact with coated magnetic cores. The cable has a center conductor that is grounded. At the two ends of a secondary winding, stress cones provide a termination of the cable. Indoor stress cones without sheds may be used if the secondary is embedded in insulation. Otherwise, outdoor stress cones with sheds to increase the leakage path may be used.

Figure 7:
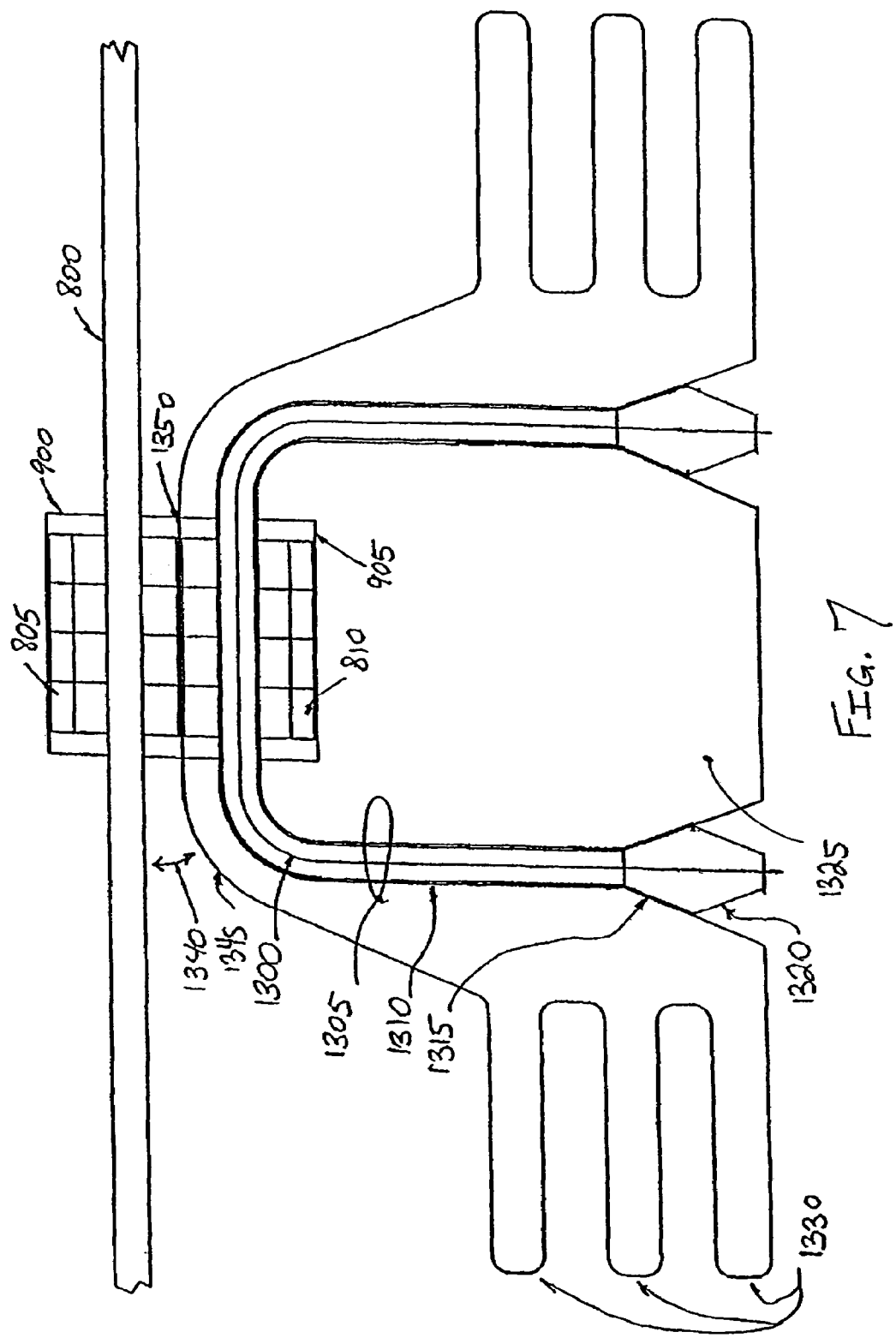
FIG. 7 is a cross section of a high voltage inductive data coupler that incorporates a cable as a secondary winding.

FIG. 7 is a cross section of another embodiment of a high voltage inductive data coupler 1345, in accordance with the present invention. Coupler 1345 uses a high voltage cable as a secondary winding.

Power line 800 passes through core section 805, which is coated by a semiconducting layer 900. A secondary winding 1300, i.e., an inner conductor of a secondary cable 1305, is grounded via chokes (not shown), and passes through a core section 810, which is encapsulated in a semiconducting layer 905. Secondary cable 1305 is coated with a semiconducting layer 1310, which connects to a semiconducting portion 1315 of a stress cone 1320. The entire lower portion of coupler 1345 is encapsulated in an insulating body 1325, equipped with sheds 1330 to provide a long leakage path between power line 800 and grounded secondary winding 1300.

Functionally, power line 800, or its thin insulation, contacts semiconducting layer 900 and brings the potential of semiconductor layer 900 close to the potential of power line 800. The terms "gap" and "air gap" are used to indicate a non-magnetic spacer or non-magnetic region between parts of a core, to increase current handling capacity and maximum magnetomotive force before saturation. Semiconducting layer 900 contacts semiconducting layer 905 at a gap 1350 between core sections 805 and 810, respectively, bringing semiconducting layer 905 close to the potential of power line 800. Secondary cable 1305 has its semiconducting layer 1310 in direct contact with semiconducting layer 905, thus also bringing semiconducting layer 1310 to a potential close to that of power line 800.

At each end of secondary cable 1305, a stress cone 1320 terminates secondary cable 1305, allowing secondary winding 1300 to exit coupler 1345 without undue local electrical stress. An air path 1340 does not bridge a high potential, as the potential of the surface of coupler 1345 is near the potential of power line 800 due to the underlying energized semiconducting layer 1310.

Secondary cable 1305 is shown in FIG. 7 with a single pass through the core. In practice, secondary cable 1305 may be configured as a coil, wound around a portion of the core.

There is thus provided another embodiment of an inductive coupler for coupling a signal to a power line. The inductive coupler includes (a) a magnetic core for placement about the power line, (b) a coil wound around a portion of the magnetic core, where the signal is coupled to the coil, and (c) a semiconducting coating that encapsulates the core and contacts the power line. Furthermore, the coil has a section of high voltage cable coated with semiconducting material, the semiconducting material being in conductive or capacitive contact with semiconducting coating, and inductive coupler also includes a stress cone at an end of the coil.

In a variation of the inductive coupler shown in FIG. 7, secondary cable 1305 and semiconducting layer 1310 could be replaced by a coaxial cable having an outer conductor. Regardless of whether coupler 1345 is configured with secondary cable 1305 and semiconducting layer 1310 or with a coaxial cable having an outer conductor, the outer layer of the secondary winding is non-insulative. Generally, coupler 1345 includes (a) a magnetic core configured of core sections 805 and 810, for placement about power line 800, and (b) a coil wound around a portion of the magnetic core. The coil includes the coaxial cable having the non-insulative layer coupled to stress cone 1320, and the non-insulative outer layer is at an electrical potential about equal to that of power line 800 when inductive coupler 1345 is installed on power line 800.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. An inductive coupler for coupling a signal to a power line, comprising:
   a magnetic core for placement about said power line; and
   a coil wound around a portion of said magnetic core,
   wherein said coil includes a coaxial cable having a non-insulative outer layer coupled to a stress cone, and
   wherein said non-insulative outer layer is at an electrical potential about equal to that of said power line when said inductive coupler is installed on said power line.

2. The inductive coupler of claim 1, wherein said non-insulative outer layer comprises a conductive material.

3. The inductive coupler of claim 1, wherein said non-insulative outer layer comprises a semiconducting material.

4. The inductive coupler of claim 1, wherein said coaxial cable includes an inner conductor that is routed through said stress cone.

5. The inductive coupler of claim 4, wherein said inner conductor is connected to ground.

6. The inductive coupler of claim 4, wherein said inner conductor is connected to ground through a choke.

7. The inductive coupler of claim 1, further comprising a semiconducting coating that encapsulates said magnetic core.

8. The inductive coupler of claim 7, wherein said semiconducting coating contacts said power line.

9. The inductive coupler of claim 7, wherein said semiconducting coating contacts said non-insulative outer layer.

10. The inductive coupler of claim 1, wherein said stress cone includes a semiconducting portion in contact with said non-insulative outer layer.

11. The inductive coupler of claim 1, wherein said signal is coupled between said coil and said power line via said magnetic core.

12. The inductive coupler of claim 1, wherein said magnetic core comprises a first portion and a second portion with an air gap therebetween.

13. An inductive coupler, comprising:
    a magnetic core having an aperture through which a power line is routable;
    a cable having a center conductor routed through said aperture, and having a portion external to said aperture;
    a stress cone through which said center conductor is routed; and
    a semiconducting coating that (a) encapsulates said magnetic core and said portion of said cable that is external to said aperture, and (b) contacts said stress cone,
    wherein said semiconducting coating contacts said power line when said inductive coupler is installed on said power line.

14. The inductive coupler of claim 13, wherein said inductive coupler couples a data signal between said coil and said power line via said magnetic core.

15. The inductive coupler of claim 13, wherein said semiconducting coating is at an electrical potential about equal to that of said power line when said inductive coupler is installed on said power line.

16. The inductive coupler of claim 13, wherein said inner conductor is connected to ground.

17. The inductive coupler of claim 13, wherein said inner conductor is connected to ground through a choke.

18. The inductive coupler of claim 13, wherein said magnetic core comprises a first portion and a second portion with an air gap therebetween.

* * * * *